(12) United States Patent
Goryca et al.

(10) Patent No.: US 12,044,758 B2
(45) Date of Patent: Jul. 23, 2024

(54) SAMPLE HOLDER FOR MEASUREMENTS OF OPTICALLY DETECTED MAGNETIC RESONANCE

(71) Applicant: Uniwersytet Warszawski, Warsaw (PL)

(72) Inventors: Mateusz Goryca, Radom (PL); Aleksander Bogucki, Warsaw (PL)

(73) Assignee: UNIWERSYTET WARSZAWSKI, Warsaw (PL)

( * ) Notice: Subject to any disclaimer, the term of this patent is extended or adjusted under 35 U.S.C. 154(b) by 94 days.

(21) Appl. No.: 17/765,565

(22) PCT Filed: Oct. 2, 2020

(86) PCT No.: PCT/IB2020/059288
§ 371 (c)(1),
(2) Date: Mar. 31, 2022

(87) PCT Pub. No.: WO2021/064687
PCT Pub. Date: Apr. 8, 2021

(65) Prior Publication Data
US 2022/0404444 A1 Dec. 22, 2022

(30) Foreign Application Priority Data
Oct. 4, 2019 (PL) .......................... 431387

(51) Int. Cl.
*G01R 33/32* (2006.01)
*G01R 33/30* (2006.01)
(52) U.S. Cl.
CPC .......... *G01R 33/323* (2013.01); *G01R 33/30* (2013.01)

(58) Field of Classification Search
CPC .............................. G01R 33/30; G01R 33/323
See application file for complete search history.

(56) References Cited

U.S. PATENT DOCUMENTS 10,585,154 B1 * 3/2020 Budakian ............... G01N 23/20
11,500,186 B2 * 11/2022 Englund ................ G02B 21/02

FOREIGN PATENT DOCUMENTS

EP        1 669 772        6/2006

OTHER PUBLICATIONS

International Search Report issued Jan. 25, 2021 in International (PCT) Application No. PCT/IB2020/059288.

(Continued)

*Primary Examiner* — Gregory H Curran
(74) *Attorney, Agent, or Firm* — Wenderoth, Lind & Ponack, L.L.P.

(57) ABSTRACT

The invention is related to a sample holder for measurements of optically detected magnetic resonance, including a bottom plate, a top plate and a middle plate, wherein all the plates are made of a dielectric material. The top plate is provided with at least one top opening, enabling continuous optical access to the studied sample during measurements. The sample is placed in the central opening provided in the middle plate. The non-magnetic conductive strips provided on the surfaces of the bottom plate, the middle plate and the top plate ensure formation of an electrical circuit, which allows coupling of the studied sample with the generated microwave radiation to be achieved once the microwave sources is switched on. The invention also includes a sample holder for measurements of optically detected magnetic resonance, enabling formation of at least one loop of the electrical circuit.

15 Claims, 8 Drawing Sheets

(56) References Cited

OTHER PUBLICATIONS

Written Opinion of the International Searching Authority issued Jan. 25, 2021 in International (PCT) Application No. PCT/IB2020/059288.

* cited by examiner

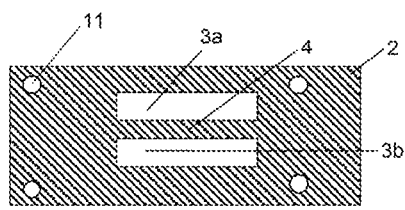
Fig. 1.1
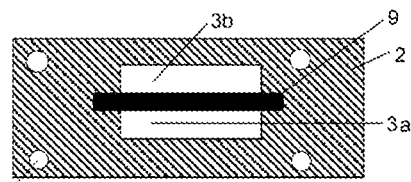
Fig. 1.2
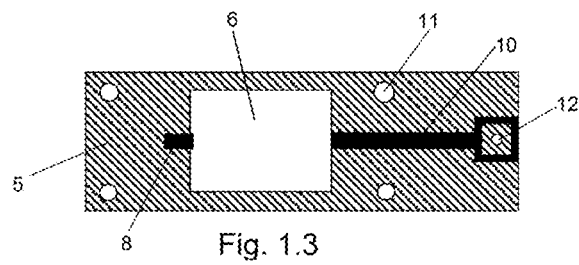
Fig. 1.3
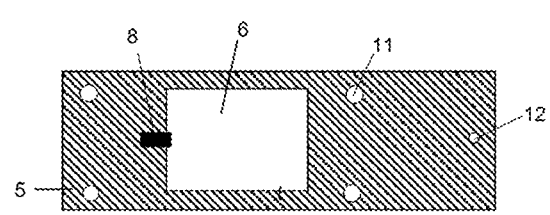
Fig. 1.4
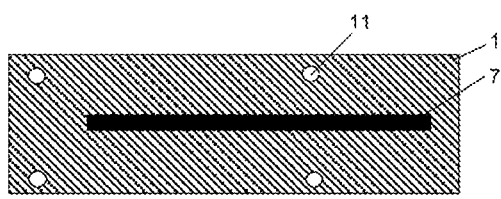
Fig. 1.5
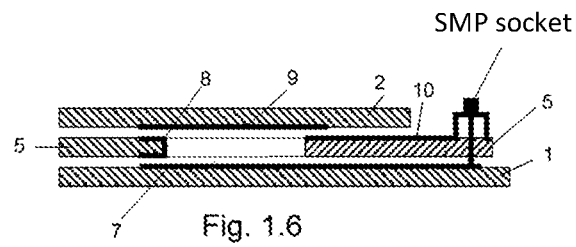
Fig. 1.6

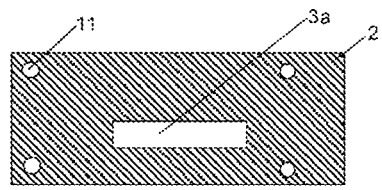
Fig. 2.1
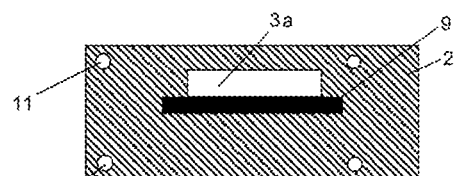
Fig. 2.2
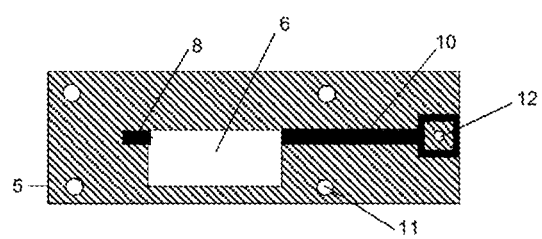
Fig. 2.3
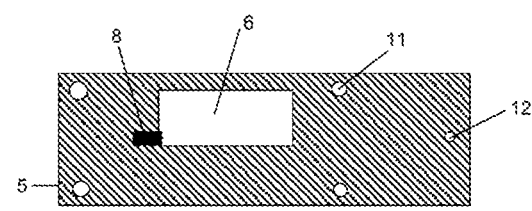
Fig. 2.4
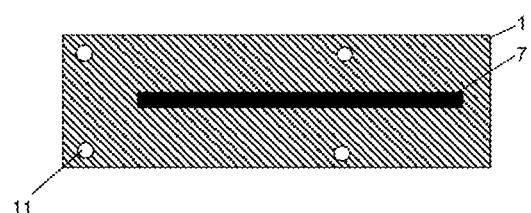
Fig. 2.5
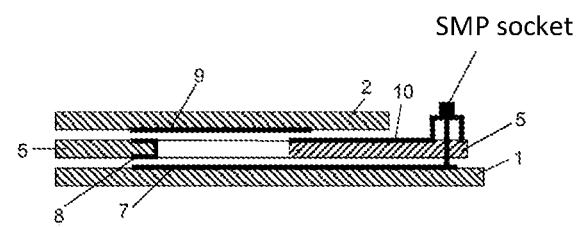
Fig. 2.6

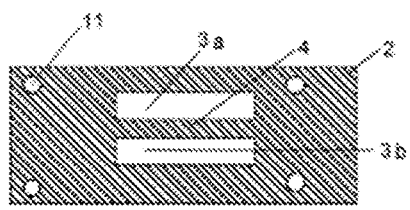
Fig. 3.1
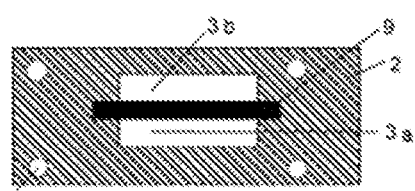
Fig. 3.2
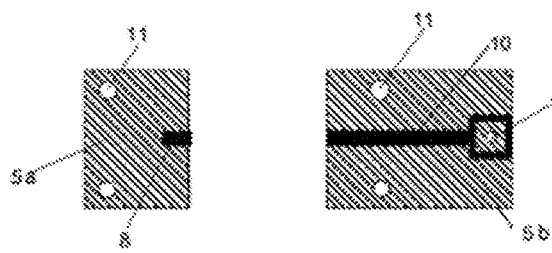
Fig. 3.3
Fig. 3.4
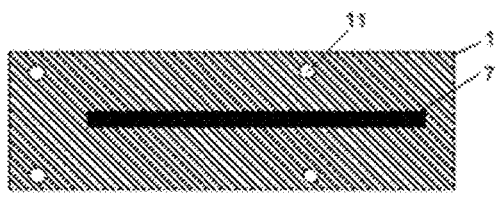
Fig. 3.5
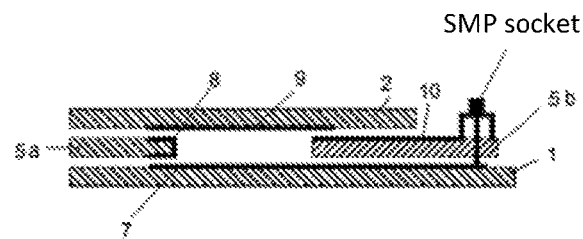
Fig. 3.6

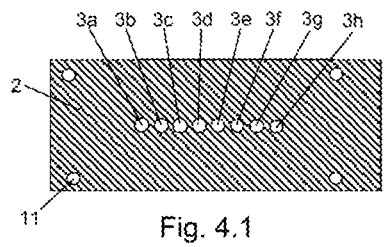
Fig. 4.1
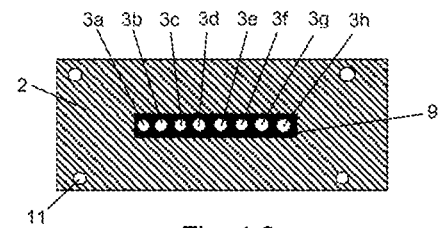
Fig. 4.2
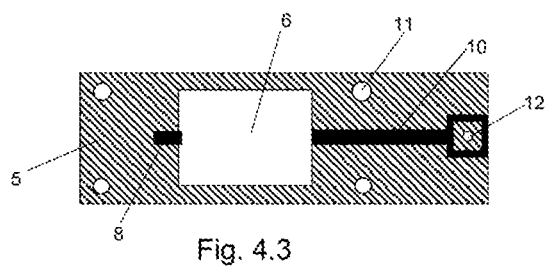
Fig. 4.3
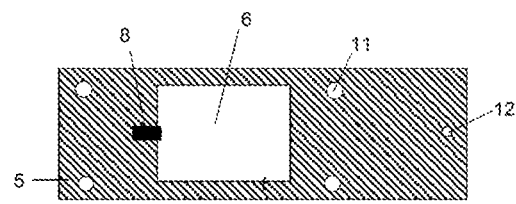
Fig. 4.4
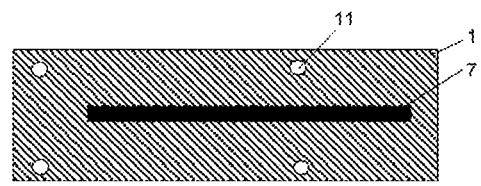
Fig. 4.5
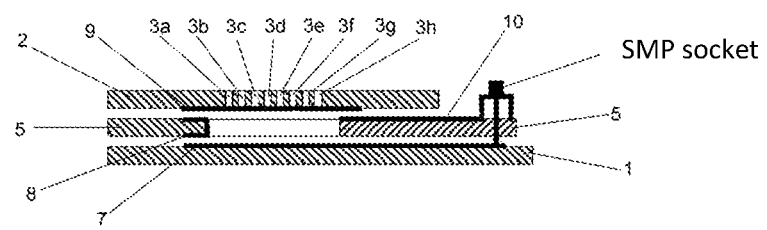
Fig. 4.6

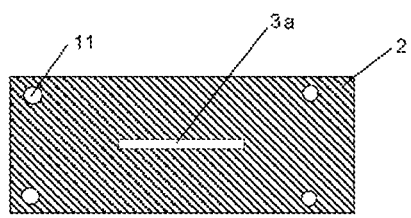
Fig. 5.1
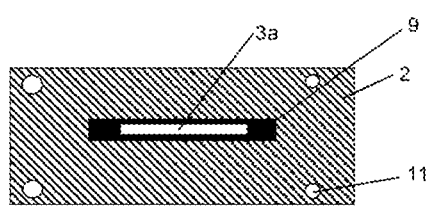
Fig. 5.2
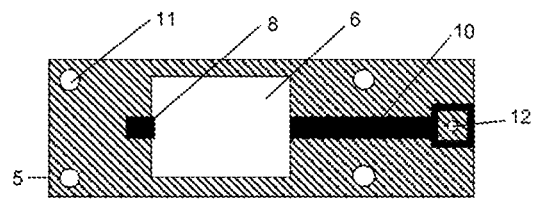
Fig. 5.3
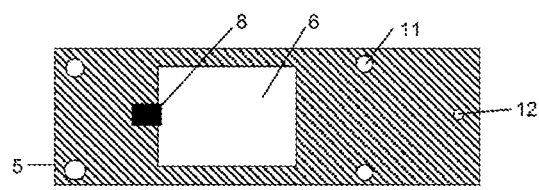
Fig. 5.4
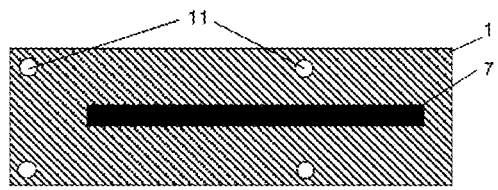
Fig. 5.5
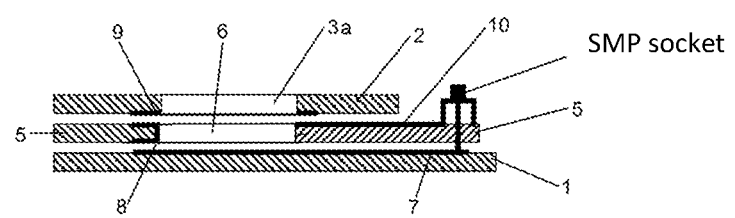
Fig. 5.6

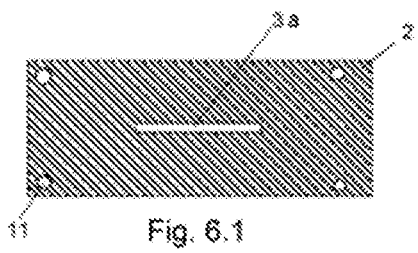
Fig. 6.1
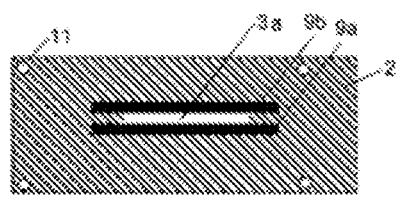
Fig. 6.2
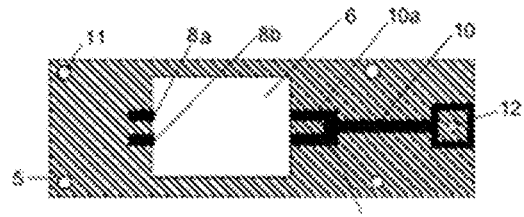
Fig. 6.3
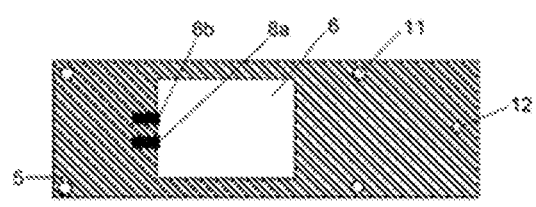
Fig. 6.4
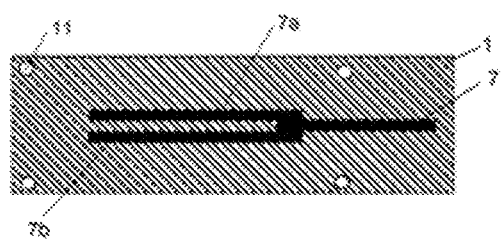
Fig. 6.5
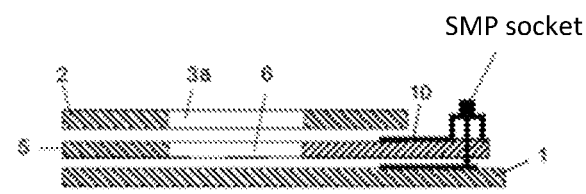
Fig. 6.6

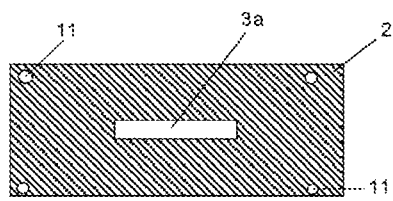
Fig. 7.1
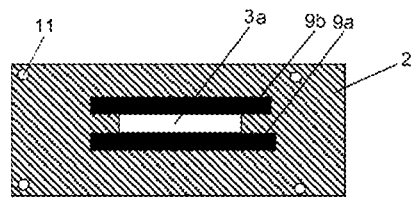
Fig. 7.2
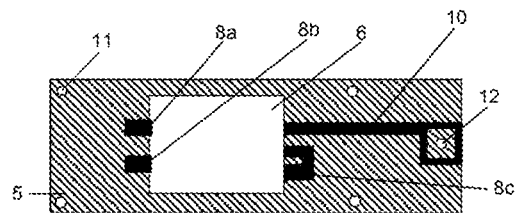
Fig. 7.3
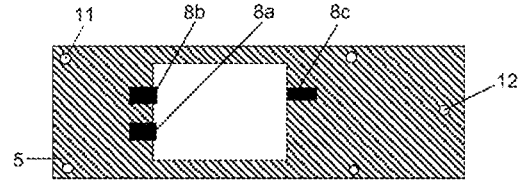
Fig. 7.4
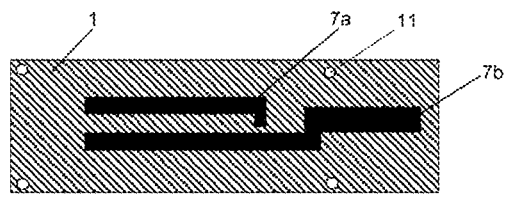
Fig. 7.5
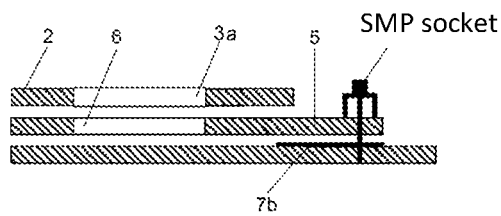
Fig. 7.6

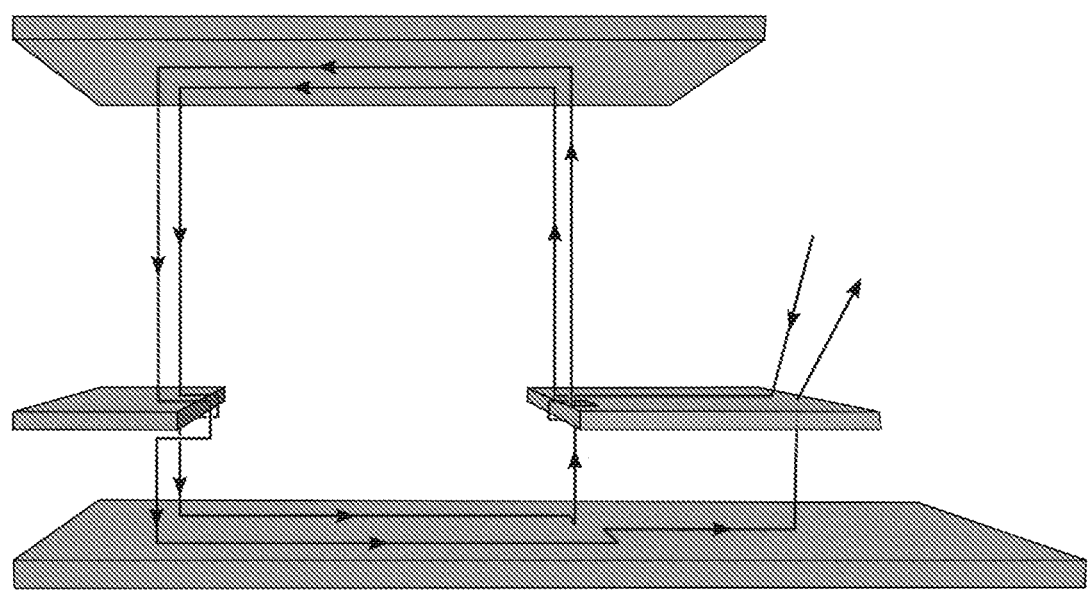
Fig. 8.1

SAMPLE HOLDER FOR MEASUREMENTS OF OPTICALLY DETECTED MAGNETIC RESONANCE

The subject of the invention is a sample holder, intended to hold and stabilise a sample during measurements using the optically detected magnetic resonance (ODMR) method. The ODMR method is a variation of the measurement method based on EPR electron resonance, wherein ODMR additionally uses optical measurements, including fluorescence, phosphorescence or absorption. A number of solutions delivering microwave radiation to a sample is known in the field of the invention, wherein some of the solutions use special holders.

The closest report in the field, namely the Master's Degree dissertation by Mr Martin Schenider, Brno University Of Technology, Brno 2017, p. 38-43, titled "Design of optically detected magnetic resonance (ODMR) spectrometer" discloses a sample holder intended to hold a sample during measurements of optically detected magnetic resonance. The holder disclosed in this document includes an antenna, installed between a brass top plate and a brass bottom plate, acting as the holder base. The top plate and the bottom plate of this holder are connected using four screws placed in the corners of the plates. The sample for testing using the ODMR method is placed directly on the antenna. A Teflon insert acting as an insulator is also provided between the antenna and the bottom plate, wherein signal is delivered to the antenna via an U.FL connector, soldered directly onto the antenna. In the holder disclosed in this document, the optical axis runs orthogonally to the sample surface, and thus to the surface of the top and the bottom plate of the holder.

In the next document, namely in the publication by K. M. Lee, pt. "Wall-less microwave cavity for optical detection of magnetic resonance"; Rev. Sci. Instrum. 53(5), May 1982, a so-called microwave cavity (resonator) for ODMR measurement was disclosed. In general, according to the publication, this cavity is made of three main parts, namely the top plate, the wall-less body and the bottom piston. The body and the top plate are connected using two screws passing through threaded openings. The bottom part of the body is threaded, enabling the piston to move, which in turns allows tuning of the resonance frequency. After coarse turning, the piston may be locked in place using a locking nut. According to the disclosure in the publication, the cavity is provided with a sample holder located outside. The holder is tightened to the end of a rod made of stainless steel, terminated with brass ends. Additionally, a stainless steel pipe with strictly defined dimensions is used to introduce the rod terminated with the holder into a cryostat unit, wherein an o-ring ensures access from outside.

The publication "High-resolution vector microwave magnetometry based on solid-state spins in diamond" by Pengfei Wang, Zhenheng Yuan, Pu Huangznane et al., Nature Communications, March 2015 also discloses another solution used in ODMR measurements, using sample sputtering. This document discloses sputtering on a metal sample in the form of very thin wire, which may be used to transfer electric current at microwave frequency, followed by electron resonance measurements coupled with optical measurements.

It may be currently said that according to the state of the field of the invention, including publications mentioned above, no solution ensuring optical access to the sample during the performed measurements while simultaneously retaining strong coupling with the microwave radiation, without the need to perform additional technological processes on the sample, such as metal sputtering, application of electrical contacts or lithography is available, while retaining compatibility with already existing systems intended for optical magnetospectroscopy and while retaining favourable, relative directions of the magnetic component of the microwave field and of the external magnetic field towards the direction of the sampling light. It is also extremely important to note that currently, no compact solutions ensuring the use and adaptation to a wide range of frequencies are available. The field of the invention also lacks solutions enabling multiple changes of studied samples, while retaining the aforementioned characteristics and without negative impact on the functional parameters of the measurement system.

Thus, the Applicant developed a solution eliminating the deficiencies and imperfections resulting from the state of the field of the invention.

The subject of the invention is a sample holder for measurements of optically detected magnetic resonance, including the top plate and the bottom plate, characterised in that a middle plate made of dielectric material, with a central opening provided in the plate, is located between the bottom plate made of dielectric material and the top plate made of dielectric material, in which at least one top opening is made. At least one conductive non-magnetic strip is present on the surface of the bottom plate oriented towards a top plate, connected at its first end to the first pole of the microwave signal carrier, and providing electrical connection at its second end with the first end of at least one central, surrounding, conductive non-magnetic strip. At least one central, surrounding, conductive non-magnetic strip is provided on the middle plate, from the side of the central opening, transversely to the side of the middle plate and wherein at least one central, surrounding, conductive non-magnetic strip overlaps both surfaces of the middle plate at its ends. The second end of at least one central, surrounding, conductive non-magnetic strip forms electrical connection with the first end of at least one top, conductive non-magnetic strip provided on the surface of the top plate oriented towards the bottom plate. The second end of at least one top, conductive non-magnetic strip forms electrical connection with the first end of at least one central, surface, conductive non-magnetic strip provided on the side of the middle plate opposite at least one central, surrounding, conductive non-magnetic strip, on the surface oriented towards the top plate. The second end of at least one central, surface, conductive non-magnetic strip is connected to the second pole of the microwave signal carrier, wherein the bottom plate, the top plate and the middle plate are detachably connected. The top opening is preferably separated with a bridge made of dielectric material. The top opening is preferably provided on the top plate, along the conductive non-magnetic strip. The middle plate is optionally made of at least two, separated plates made of dielectric material. The dielectric material is preferably a glass fibre reinforced epoxy laminate, particularly FR-4. The central opening is preferably provided as a space for placing a sample therein, wherein the sample is placed between the bottom plate and the top plate. The bottom, conductive non-magnetic strip, the central, surrounding, conductive non-magnetic strip, the top, conductive non-magnetic strip and the central, surface, conductive non-magnetic strip are optionally made of metal, such as copper or gold, and are preferably made of gold-plated copper.

The bottom plate, the top plate and the middle plate are preferably provided with connecting openings, through which detachable connections pass through. The detachable connections are provided as screws made of conductive non-magnetic material. At least one top opening preferably has rectangular cross-section. The bottom, conductive non-magnetic strip and the central, surface, conductive non-magnetic strip are preferably connected at one of their ends with the poles of the microwave signal carrier via a microwave socket, preferably a SMP-type socket. The height of the middle plate is preferably larger than the height of the studied sample.

The subject of the invention also includes a sample holder for measurements of optically detected magnetic resonance, including the top plate and the bottom plate, characterised in that a middle plate made of dielectric material, with a central opening provided in the plate, is located between the bottom plate made of dielectric material and the top plate made of dielectric material, in which the top opening is made. Conductive non-magnetic strips are applied onto the top plate, the middle plate and the top plate, which are connected and form at least one loop of an electrical circuit. The dielectric material is preferably a glass fibre reinforced epoxy laminate, preferably FR-4. The middle plate is optionally made of at least two separated parts made of a dielectric material.

The conductive non-magnetic strips are preferably made of metal, such as copper or gold, most preferably of gold-plated copper. The bottom plate, the top plate and the middle plate are preferably provided with connecting openings, through which detachable connections pass through. The detachable connection is optionally provided as screws made of non-magnetic material. The top opening preferably has a rectangular cross-section.

The height of the middle plate is preferably larger than the height of the studied sample. Optionally, at least one loop of the electrical circuit is terminated with a microwave socket, preferably a SMP-type socket.

The principle of operation of the holder according to the invention is based on the studied sample placed between the top plate and the bottom plate, inside the central opening in the middle plate, and then the bottom plate, the top plate and the middle plate are connected using the detachable connection. Such a connection of holder elements results in the sample being surrounded in the plane orthogonal to its top surface by a loop formed as a result of electrical contact between at least one bottom, conductive non-magnetic strip, at least one central, surrounding, conductive non-magnetic strip, at least one top, conductive non-magnetic strip and at least one central, surface, conductive non-magnetic strip. Next, the free end of at least one bottom, conductive non-magnetic strip and the free end of at least one central, surface, conductive non-magnetic strip are connected, respectively, with poles of the microwave signal carrier connected to a microwave generator. When the microwave source is turned on, coupling of the studied sample with microwave radiation may be achieved, wherein at least one top opening in the top plate ensures continuous optical access to the studied sample during the measurement, making studies using the ODMR method possible. The holder according to the invention does not required additional technological operations to be performed on the sample, such as metal sputtering or application of electrical contacts onto the sample. The design of the holder according to the invention ensures compatibility with the already existing systems and devices used in optical magnetospectroscopy. Additionally, the described solution is characterised by its compact size and enables its use with a wide range of frequencies, as well as enables measurements in cryogenic temperatures. An additional advantage of the holder according to the invention lies in the fact that it enables the studied samples to be replaced repeatedly without a negative impact on functional parameters of the measurement system. The described holder additionally ensures advantageous direction of the magnetic component of microwave radiation towards the direction of the sampling light and towards the external magnetic field. Thus, technical issues resulting from solutions disclosed in the field have been solved thanks to the holder according to the invention.

The sample holder for measurements of optically detected magnetic resonance is presented in embodiments of the invention and in the figures, in which:

FIG. 1.1 presents a top view of the top plate of the holder according to the invention, according to the first embodiment;

FIG. 1.2 presents a bottom view of the top plate of the holder according to the invention, according to the first embodiment;

FIG. 1.3 presents a top view of the middle plate of the holder according to the invention, according to the first embodiment;

FIG. 1.4 presents a bottom view of the middle plate of the holder according to the invention, according to the first embodiment;

FIG. 1.5 presents a top view of the bottom plate of the holder according to the invention, according to the first embodiment;

FIG. 1.6 presents a cross-section through the sample holder, including the SMP socket, according to the first embodiment of the invention;

FIG. 2.1 presents a top view of the top plate of the holder according to the invention, according to the second embodiment, in which the top opening is located asymmetrically;

FIG. 2.2 presents a bottom view of the top plate of the holder according to the invention, according to the second embodiment, in which the top opening is located asymmetrically;

FIG. 2.3 presents a top view of the middle plated of the holder according to the invention, according to the second embodiment, in which the central opening is located asymmetrically;

FIG. 2.4 presents a bottom view of the middle plate of the holder according to the invention, according to the second embodiment, in which the central opening is located asymmetrically;

FIG. 2.5 presents a top view of the bottom plate of the holder according to the invention, according to the second embodiment;

FIG. 2.6 presents a cross-section through the sample holder, including the SMP socket, according to the second embodiment of the invention;

FIG. 3.1 presents a top view of the top plate of the holder according to the invention, according to the third embodiment;

FIG. 3.2 presents a bottom view of the top plate of the holder according to the invention, according to the third embodiment;

FIG. 3.3 presents a top view of two separated, middle plates of the holder according to the invention, according to the third embodiment;

FIG. 3.4 presents a bottom view of two separated, middle plates of the holder according to the invention, according to the third embodiment;

FIG. 3.5 presents a top view of the bottom plate of the holder according to the invention, according to the third embodiment;

FIG. 3.6 presents a cross-section through the sample holder, including the SMP socket, according to the third embodiment of the invention;

FIG. 4.1 presents a top view of the top plate of the holder according to the invention, according to the fourth embodiment, in which the top opening comprises of eight top openings in a series;

FIG. 4.2 presents a bottom view of the top plate of the holder according to the invention, according to the fourth embodiment, in which the top opening comprises of eight top openings in a series;

FIG. 4.3 presents a top view of the middle plate of the holder according to the invention, according to the fourth embodiment;

FIG. 4.4 presents a bottom view of the middle plate of the holder according to the invention, according to the fourth embodiment;

FIG. 4.5 presents a top view of the bottom plate of the holder according to the invention, according to the fourth embodiment;

FIG. 4.6 presents a cross-section through the sample holder, including the SMP socket, according to the fourth embodiment of the invention;

FIG. 5.1 presents a top view of the top plate of the holder according to the invention, according to the fifth embodiment, in which the top opening is not divided by a bridge;

FIG. 5.2 presents a bottom view of the top plate of the holder according to the invention, according to the fifth embodiment, in which the top opening is surrounded by the top, conductive non-magnetic strip;

FIG. 5.3 presents a top view of the middle plate of the holder according to the invention, according to the fifth embodiment;

FIG. 5.4 presents a bottom view of the middle plate of the holder according to the invention, according to the fifth embodiment;

FIG. 5.5 presents a top view of the bottom plate of the holder according to the invention, according to the fifth embodiment;

FIG. 5.6 presents a cross-section through the sample holder, including the SMP socket, according to the fifth embodiment of the invention;

FIG. 6.1 presents a top view of the top plate of the holder according to the invention, according to the sixth embodiment, in which the conductive non-magnetic strips are separated;

FIG. 6.2 presents a bottom view of the top plate of the holder according to the invention, according to the sixth embodiment, in which the conductive non-magnetic strips are separated;

FIG. 6.3 presents a top view of the middle plate of the holder according to the invention, according to the sixth embodiment, in which the conductive non-magnetic strips are separated;

FIG. 6.4 presents a bottom view of the middle plate of the holder according to the invention, according to the sixth embodiment, in which the conductive non-magnetic strips are separated;

FIG. 6.5 presents a top view of the bottom plate of the holder according to the invention, according to the sixth embodiment, in which the conductive non-magnetic strips are separated;

FIG. 6.6 presents a cross-section through the sample holder, including the SMP socket, according to the sixth embodiment of the invention, in which the conductive non-magnetic strips are separated;

FIG. 7.1 presents a top view of the top plate of the holder according to the invention, according to the seventh embodiment, in which two loops of the electrical circuit are formed;

FIG. 7.2 presents a bottom view of the top plate of the holder according to the invention, according to the seventh embodiment, in which two loops of the electrical circuit are formed;

FIG. 7.3 presents a top view of the middle plate of the holder according to the invention, according to the seventh embodiment, in which two loops of the electrical circuit are formed;

FIG. 7.4 presents a bottom view of the middle plate of the holder according to the invention, according to the seventh embodiment, in which two loops of the electrical circuit are formed;

FIG. 7.5 presents a top view of the bottom plate of the holder according to the invention, according to the seventh embodiment, in which two loops of the electrical circuit are formed;

FIG. 7.6 presents a cross-section through the sample holder, including the SMP socket, according to the seventh embodiment of the invention, in which two loops of the electrical circuit are formed;

FIG. 8.1 presents a perspective view of the course of two loops of the electrical circuit according to the seventh embodiment of the invention;

EXAMPLE EMBODIMENT 1

In the first embodiment of the invention a sample holder is provided for measurements of optically detected magnetic resonance, which includes the bottom plate 1, the top plate 2 and the middle plate 5, wherein the bottom plate 1 has dimensions 25 mm×60 mm×1 mm, the top plate 2 has dimensions 25 mm×45 mm×1 mm, while the middle plate has dimensions 25 mm×55 mm×0.5 mm. The middle plate 5 is provided with a rectangular, central opening 6, which has dimensions 16 mm×20 mm×0.5 mm. In the top plate 2, the top opening is formed by two rectangular, top openings 3a and 3b, divided symmetrically along the longer side of the top plate 2 by a bridge 4, also made of FR-4, with a width of 1 mm. Connecting openings 11 with a 1.5 mm diameter are provided coaxially in all three plates, wherein brass screws with nuts made of the same material pass through said openings. On surface of the bottom plate 1 oriented towards the top plate 2, the bottom, conductive non-magnetic strip 7 is provided, with a width of 1 mm, length of 46 mm and thickness of 35 μm, made of gold-plated copper. The bottom, conductive non-magnetic strip 7 is connected at its first end, via the SMP microwave socket, and through the socket opening 12, with the first pole of the microwave signal carrier, in the form of a microwave cable, while at its second end it forms an electrical connection with the first end of the central, surrounding, conductive non-magnetic strip 8, the width of which is equal to the width of the bottom, conductive non-magnetic strip 7 and is equal 1 mm, while its thickness is 100 μm. In the holder according to this embodiment, the central, surrounding, conductive non-magnetic strip 8 is placed on the middle plate 5 from the side of the central opening 6, transversely to the side of the middle plate 5, and its ends overlap both surfaces of the middle plate 5 by 2 mm each. The second end of the surrounding, conductive non-magnetic strip 8 forms an electrical connection with the first end of the top, conductive non-magnetic strip 9, the width of which is also 1 mm and which is placed on the surface of the top plate 2 oriented towards the bottom plate 1. The top, conductive non-magnetic strip 9 passes across the bridge 4. The second end of the top, conductive non-magnetic strip 9 forms an electrical connection with the first end of the central, surface, conductive non-magnetic strip 10 provided on the side of the middle plate 5 opposite to the central, surrounding, conductive non-magnetic strip 8 on the side of the middle plate 5, on the surface oriented towards the top plate 2. The width of the central, surface, conductive non-magnetic strip 10 is 1 mm. The second end of the central, surface, conductive non-magnetic strip 10 is connected with the second pole of the microwave signal carrier via the aforementioned, SMP microwave socket.

In the holder according to embodiment 1, a sample in the form of a quantum well was placed, 10 nanometre thick, made of cadmium telluride and doped with manganese ($Cd_{1-x}Mn_xTe$, x=0.26%), the 50 nm thick barriers of which were made of cadmium telluride doped with magnesium ($Cd_{1-x}Mg_xTe$, x=15%). The well was made using epitaxy, with molecular bundles, on a 350 micrometre thick substrate made of gallium arsenide, covered with a buffer layer of cadmium telluride, 5 micrometre thick. The sample dimensions were 5 mm×5 mm×0.35 mm. Next, radiation with 15 GHz frequency and −15 dBm power was supplied from a generator using a microwave cable. Additionally, through the top openings 3a and 3b in the top plate 2, a laser light beam with a wavelength of 647 nm was directed onto the sample and a measurement of optically detectable magnetic resonance was performed at 1.6 K. The obtained results allowed a conclusion stating that the holder according to the invention ensures the required optical access to the studied sample, while retaining strong coupling with microwave radiation, thus the holder according to the invention enables correct measurements using the ODMR method. Additionally, thanks to its the design, the holder according to the invention was used in measurements using other frequencies in the ranges between 10 GHz and 28 GHz, indicating that it may be re-used without deterioration of functional properties of the system.

EXAMPLE EMBODIMENT 2

In the second embodiment of the invention, the sample holder for measurements of optically detected magnetic resonance was prepared similarly to the first embodiment, with the difference that one rectangular top opening 3a with dimensions 8 mm×20 mm×0.5 mm is made in the top plate 2. The top opening 3a is placed asymmetrically in relation to the width of the plate, namely, is located closer to one of the longer sides of the top plate 2. The middle plate 5 is provided with a rectangular, central opening 6, which is locate asymmetrically, similar to opening 3a. The central opening 6 has dimensions of 16 mm×20 mm×0.5 mm and is located closer to one of the longer sides of the top plate 2, similar to the top opening 3a. In this embodiment, the top, conductive non-magnetic strip 9, provided on the top plate 2 on the side of the bottom plate 1, is placed in parallel and at the same distance to the two longer sides of the top plate 2. The asymmetrical position of the central opening 6 implies that the surrounding, conductive non-magnetic strip 8 and the central, surface, conductive non-magnetic strip 10 are located closer to one of the two longer sides of the central opening 6. Bridge 4 is absent in this embodiment, wherein the other technical characteristics are analogous to the first embodiment of the invention.

EXAMPLE EMBODIMENT 3

A sample holder for measurements of optically detected magnetic resonance was prepared in the third embodiment of the invention, similarly to the first embodiment of the invention, with the difference that the central plate 5 comprises of two separated plates 5a and 5b, made of a dielectric material. Plates 5a and 5b are provided with connecting openings 11.

EXAMPLE EMBODIMENT 4

In the fourth embodiment of the invention, a sample holder for measurements of optically detected magnetic resonance was prepared similarly to the first embodiment, with the difference that the top opening includes eight top openings 3a, 3b, 3c, 3d, 3e, 3f, 3g, 3h with a diameter of 1 mm in a series, wherein the top, conductive non-magnetic strip 9, provided on the top plate 2 on the side of the bottom plate 1, is placed in parallel and along the eight top openings 3a, 3b, 3c, 3d, 3e, 3f, 3g, 3h, comprising the top opening. Bridge 4 is absent in this sample holder according to the invention in this embodiment, wherein the other technical characteristics are analogous to the first embodiment of the invention.

EXAMPLE EMBODIMENT 5

In the fifth embodiment of the invention, a sample holder for measurements of optically detected magnetic resonance was prepared similarly to the first embodiment, with the difference that only one, parallel and located at the same distance to the two longer sides of the top plate 2, rectangular top opening 3a with dimensions 0.5 mm×16 mm×0.5 mm is made in the top plate 2. In this embodiment, the top, conductive non-magnetic strip 9 provided on the top plate 2, on the side of the bottom plate 1, surrounds the top opening 3a. In addition, bridge 4 is absent in the sample holder according to this embodiment, wherein the other technical characteristics are analogous to the first embodiment of the invention.

Maximum magnetic field is obtained in the middle of the sample thanks to this solution, which is of particular importance in the case of small samples.

EXAMPLE EMBODIMENT 6

In the sixth embodiment of the invention, a sample holder for measurements of optically detected magnetic resonance was prepared, which enables two parallel loops of the electrical circuits to be formed thanks to its design, thus additionally increasing the value of the magnetic component of the microwave on the sample surface. The holder according to this embodiment is similar to the holder according to the fifth embodiment of the invention, with the difference that the bottom, conductive non-magnetic strip 7 is separated into two parallel strip in the area of the central opening 6, i.e. into the bottom, conductive non-magnetic strip 7a and the bottom, conductive non-magnetic strip 7b. In the non-separated part, the bottom, conductive non-magnetic strip 7 is connected, via the SMP microwave socket, through the socket opening (12), with the first pole of the microwave signal carrier, provided in the form of a microwave cable. The central, surrounding, conductive non-magnetic strip 8, provided on the middle plate 5 on the side of the central opening 6, transversely to the side of the middle plate 6, is separated in this embodiment into two parallel strips, i.e. into the central, surrounding, conductive non-magnetic strip 8a and the central, surrounding, conductive non-magnetic strip 8b. In this embodiment, the middle plate 5 has dimensions of 25 mm×55 mm×0.5 mm and is made of FR-4, wherein the central opening 6 has rectangular shape, with dimensions of 16 mm×20×0.5 mm. The bottom, conductive non-magnetic strip 7a forms electrical connection with the first end of the central, surrounding, conductive non-magnetic strip 8a, while the bottom, conductive non-magnetic strip 7b forms electrical connection with the first end of the central, surrounding, conductive non-magnetic strip 8b. In this embodiment, the top, conductive non-magnetic strip 9 is separated into two parallel strips, i.e. the top, conductive non-magnetic strip 9a and the top, conductive non-magnetic strip 9b. The dimensions of the top, conductive non-magnetic strip 9a are 1 mm×25 mm, while the dimensions of the top, conductive non-magnetic strip 9b are 1 mm×25 mm. In parallel, the top opening 3 with dimensions of 1 mm×25 mm×0.5 mm is provided between the top, non-magnetic trip 9a and the top, conductive non-magnetic strip 9b. The second end of the central, surrounding, conductive non-magnetic strip 8a forms electrical connection with the first end of the top, conductive non-magnetic strip 9a, and the second end of the central, surrounding, conductive non-magnetic strip 8b forms electrical connection with the first end of the top, conductive non-magnetic strip 9b. In this embodiment, the central, surface, conductive non-magnetic strip 10 is separated at its first end located at the central opening 6 into two parallel strips, i.e. the central, surface, conductive non-magnetic strip 10a and the central, surface, conductive non-magnetic strip 10b. The second end of the top, conductive non-magnetic strip 9a is connected with the first end of the central, surface, conductive non-magnetic strip 10a, while the second end of the first, conductive non-magnetic strip 9b is connected with the first end of the central, surface, conductive non-magnetic strip 10b. The second end of the central, surface, conductive non-magnetic strip 10a and the second end of the central, surface, conductive non-magnetic strip 10a connect and form the second end of the central, surface, conductive non-magnetic strip 10, which is connected with the second pole of the microwave signal carrier via the SMP microwave socket.

This solution ensures increased homogeneity of the magnetic component of the microwave, as well as zero gradient of magnetic field along the axis between the conductive, conductive non-magnetic strips.

EXAMPLE EMBODIMENT 7

In the next, seventh embodiment of the invention, a sample holder for measurements of optically detected magnetic resonance, the design of which ensures formation of two spatially parallel loops of the electrical circuit, connected electrically in series. The holder includes the bottom plate 1, the top plate 2 and the middle plate 5, wherein the bottom plate 1 has dimensions 25 mm×60 mm×1 mm, the top plate 2 has dimensions 25 mm×45 mm×1 mm, while the middle plate has dimensions 25 mm×55 mm×0.5 mm. The middle plate 5 is provided with a rectangular, central opening 6, with dimensions of 16 mm×20 mm×0.5 mm, while the top plate 2 is provided with the top opening 3a with dimensions of 2 mm×16 mm×0.5 mm. The bottom plate 1, the top plate 2 and the middle plate 5 are made of FR-4.

The central, surface, conductive non-magnetic strip 10 with 1 mm width, 20 mm length and 35 μm thickness is provided on the surface of the middle plate 5 oriented towards the top plate 2. The central, surface, conductive non-magnetic strip 10 is provided asymmetrically in relation to the width of the middle plate 5 and is located 8 mm away from one of the two longer edges of the middle plate 5 and 16 mm away from the other of the two longer edges of the middle plate 5. Two parallel strips, i.e. the top, conductive non-magnetic strip 9a and the top, conductive non-magnetic strip 9b, between which the top opening 3a is provided, are provided on the surface of the top plate 2 oriented towards the bottom plate 1. The central, surrounding, conductive non-magnetic strip 8, provided on the middle plate 5 on the side of the central opening 6, transversely to the side of the middle plate 6, is separated in this embodiment into two parallel strips, i.e. into the central, surrounding, conductive non-magnetic strip 8a and the central, surrounding, conductive non-magnetic strip 8b. In addition, in order to form two circuit loops connected in series, a central, surrounding, conductive non-magnetic strip 8c is provided on the side of the central opening 6 opposite to the central, surrounding, conductive non-magnetic strip 8b, which is C-shaped and turned towards the central opening 6 on the surface of the middle plate 5 oriented towards the top plate 2.

In this embodiment, the bottom, conductive non-magnetic strip 7 is separated into two parallel strips, i.e. the bottom, conductive non-magnetic strip 7a and the bottom, conductive non-magnetic strip 7b. The bottom, conductive non-magnetic strip 7a is bent at a 90° angle towards the bottom, conductive non-magnetic strip 7b on the side of the SMP connector.

The middle, surface, conductive non-magnetic strip 10 is connected at its first end with the first pole of the microwave signal carrier, provided as a microwave cable, using the SMP microwave socket. The second end of the central, surface, conductive non-magnetic strip 10 provided at the edge of the central opening 6 is connected with the first end of the top, conductive non-magnetic strip 9a. The second end of the top, conductive non-magnetic strip 9a is connected with the first end of the central, surrounding, conductive non-magnetic strip 8a, while the second end of the central, surrounding, conductive non-magnetic strip 8a is connected with the first end of the bottom, conductive non-magnetic strip 7a. The second end of the bottom, conductive non-magnetic strip 7a is connected with the first end of the central, surrounding, conductive non-magnetic strip 8c. The second end of the central, surrounding, conductive non-magnetic strip 7c is connected with the first end of the top, conductive non-magnetic strip 9b, while the second end of the top, conductive non-magnetic strip 9b is connected with the first end of the central, surrounding, conductive non-magnetic strip 8b, and the second end of the central, surrounding, conductive non-magnetic strip 8b is connected with the first end of the bottom, conductive non-magnetic strip 7b. The second end of the bottom, conductive non-magnetic strip 7 is connected, via the SMP microwave socket, through the socket opening (12), with the second pole of the microwave signal carrier, provided in the form of a microwave cable.

Such solution enables higher value of the magnetic component of the microwave to be achieved under resonance conditions.

EXAMPLE EMBODIMENT 8

In the eighth embodiment of the invention, a sample holder for measurements of optically detected magnetic resonance was prepared, similarly to the first embodiment, with the difference that the SMP microwave socket was rotated at an angle of 90° towards its initial orientation in the first embodiment of the invention. The SMP socket is connected, using a solder, at one of its poles with the conductive non-magnetic strip 10 of the middle plate 5, while at the other end is connected with the conductive non-magnetic strip 7 provided on the bottom plate 1. Such a modification of the SMP socket facilitates connection of a microwave cable, as well as placement of the handle according to the invention inside the laser beam.

The invention claimed is:

1. A sample holder intended for measurements of optically detected magnetic resonance, including a bottom plate and a top plate, characterised in that between the bottom plate, made of a dielectric material, and the top plate, made of dielectric material, in which at least one top opening is provided, the middle plate made of a dielectric material is provided, in which the central opening is provided, wherein at least one bottom, conductive non-magnetic strip is provided on the surface of the bottom plate oriented towards the top plate, which is connected at its first end with the first pole of the microwave signal carrier, while at its second end it forms an electrical connection with the first end of at least one central, surrounding, conductive non-magnetic strip, and wherein at least one central, surrounding, conductive non-magnetic strip is provided on the middle plate from the side of the central opening, transversely to the side of the middle plate, and wherein at least one central, surrounding, conductive non-magnetic strip is overlapping at its ends with both surfaces of the middle plate, while the second end of at least one central, surrounding, conductive non-magnetic strip forms an electrical connection with the first end of at least one top, conductive non-magnetic strip, which is provided on the surface of the top plate oriented towards the bottom plate, and the second end of at least one top, conductive non-magnetic strip forms electrical connection with the first end of at least one central, surface, conductive non-magnetic strip, which is provided on the side of the middle plate opposite to at least one central, surrounding, conductive non-magnetic strip, on the surface oriented towards the top plate, and wherein the second end of at least one, central, surface, conductive non-magnetic strip is connected with the other pole of the microwave signal carrier, wherein the bottom plate, the top plate and the middle plate are detachably connected.

2. The holder according to claim 1, wherein characterised in that the top opening is divided by a bridge, made of a dielectric material.

3. The holder according to claim 1, wherein the top opening is provided on the top plate along the conductive non-magnetic strip.

4. The holder according to claim 1, wherein the middle plate is made of at least two, separated plates made of a dielectric material.

5. The holder according to claim 1, wherein the dielectric material is a glass fiber-reinforced epoxy laminate.

6. The holder according to claim 1, wherein the central opening comprises space for sample placement therein, wherein the sample is placed between the bottom plate and the top plate.

7. The holder according to claim 1, wherein the bottom, conductive non-magnetic strip, the central, surrounding, conductive non-magnetic strip, the top, conductive non-magnetic strip and the central, surface, conductive non-magnetic strip are made of copper, gold or gold-plated copper.

8. The holder according to claim 1, wherein the bottom plate, the top plate and the middle plate are provided with connecting openings, through which detachable connections pass through.

9. The holder according to claim 8, wherein the detachable connections are provided as screws made of a non-magnetic material.

10. The holder according to claim 1, wherein at least one top opening has a rectangular shape.

11. The holder according to claim 1, wherein the bottom, conductive non-magnetic strip and the central, surface, conductive non-magnetic strip are connected at one of their ends with the poles of the microwave signal carrier via the microwave socket.

12. The holder according to claim 1, wherein the height of the middle plate is bigger than the height of the studied sample.

13. The holder according to claim 5, wherein the glass fiber-reinforced epoxy laminate is FR-4.

14. The holder according to claim 7, wherein the bottom, conductive non-magnetic strip, the central, surrounding, conductive non-magnetic strip, the top, conductive non-magnetic strip and the central, surface, conductive non-magnetic strip are made of gold-plated copper.

15. The holder according to claim 11, wherein the microwave socket is a SMP-type socket.

* * * * *